(12) United States Patent
Cho

(10) Patent No.: US 9,057,501 B2
(45) Date of Patent: Jun. 16, 2015

(54) LIGHT EMITTING DEVICE PACKAGE

(71) Applicant: LG INNOTEK CO., LTD., Seoul (KR)

(72) Inventor: Hyun Seok Cho, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/868,812

(22) Filed: Apr. 23, 2013

(65) Prior Publication Data
US 2014/0009941 A1    Jan. 9, 2014

(30) Foreign Application Priority Data

Jul. 6, 2012  (KR) .......................... 10-2012-0073696

(51) Int. Cl.
| | |
|---|---|
| H01L 23/552 | (2006.01) |
| F21V 19/00 | (2006.01) |
| H01L 25/075 | (2006.01) |
| H01L 33/60 | (2010.01) |
| H01L 33/62 | (2010.01) |
| H01L 23/544 | (2006.01) |
| H01L 23/00 | (2006.01) |

(52) U.S. Cl.
CPC ........ *F21V 19/0015* (2013.01); *H01L 25/0753* (2013.01); *H01L 33/60* (2013.01); *H01L 33/62* (2013.01); *H01L 2224/48091* (2013.01); *H01L 2224/48137* (2013.01); *H01L 2224/73265* (2013.01); *H01L 24/48* (2013.01); *H01L 24/49* (2013.01); *H01L 24/85* (2013.01); *H01L 2224/49109* (2013.01); *H01L 2224/85122* (2013.01); *H01L 2924/00014* (2013.01); *H01L 23/544* (2013.01); *H01L 2223/5442* (2013.01); *H01L 2223/54426* (2013.01); *H01L 2223/54486* (2013.01)

(58) Field of Classification Search
USPC .................... 257/660, 98, 680, 700, E33.056, 257/E23.001, E21.499
See application file for complete search history.

(56) References Cited

U.S. PATENT DOCUMENTS

2009/0014732 A1* 1/2009 Nishida et al. .................. 257/88

* cited by examiner

*Primary Examiner* — Timor Karimy
(74) *Attorney, Agent, or Firm* — KED & Associates LLP

(57) ABSTRACT

Disclosed is a light emitting device package including a reflective substrate including a chip mounting region, a circuit substrate disposed on the reflective substrate, the circuit substrate including an inside edge defining the chip mounting region and at least one aligning hole disposed at a position spaced from the inside edge, and at least one light emitting diode chip disposed in the chip mounting region, the at least one light emitting diode chip being connected to the circuit substrate through a wire.

9 Claims, 12 Drawing Sheets

LIGHT EMITTING DEVICE PACKAGE

CROSS REFERENCE TO RELATED APPLICATION

This application claims priority under 35 U.S.C. §119 to Korean Patent Application No. 10-2012-0073696, filed in Korea on 6 Jul. 2012, which is hereby incorporated in its entirety by reference as if fully set forth herein.

TECHNICAL FIELD

Embodiments relate to a light emitting device package.

BACKGROUND

A light emitting device may be a light emitting diode (LED) chip. The light emitting diode is a semiconductor device which converts electrical energy into light. The light emitting diode has advantages such as low power consumption, semi-permanent lifespan, rapid response speed, safety and eco-friendliness, as compared to conventional light sources such as incandescent lamps or fluorescent lamps. A great deal of research to substitute conventional light sources by light emitting diodes has been made. Use of light emitting diodes as light sources for lighting devices such as various lamps, liquid crystal devices, electronic scoreboards and streetlamps is gradually increasing.

Meanwhile, a light emitting device package includes light emitting diode chips mounted on a printed circuit board (PCBs). When a plurality of light emitting diode chips are mounted on one PCB in a conventional light emitting device package, the light emitting diode chips need to be in accurate alignment with the position of wires.

SUMMARY

Embodiments provide a light emitting device package to accurately align both light emitting diode chips and wires.

In one embodiment, a light emitting device package includes a reflective substrate including a chip mounting region, a circuit substrate disposed on the reflective substrate, the circuit substrate including an inside edge defining the chip mounting region and at least one aligning hole disposed at a position spaced from the inside edge, and at least one light emitting diode chip disposed in the chip mounting region, the at least one light emitting diode chip being connected to the circuit substrate through a wire.

For example, the inside edge of the circuit substrate may have a round shape.

The circuit substrate includes a first circuit substrate and a second circuit substrate facing each other with interposing the chip mounting region therebetween, the first circuit substrate has a first inside edge defining one part of the chip mounting region, the second circuit substrate has a second inside edge defining another part of the chip mounting region, and each of the first and second circuit substrates has the at least one aligning hole.

For example, a diameter, or a length of a side of the aligning hole may be 0.4 mm.

The circuit substrate may include a wiring layer, a first insulating layer disposed between the wiring layer and the reflective substrate, and a metal layer having a connection portion disposed on the wiring layer, the connection portion electrically connecting the wire connected to the light emitting diode chip to the wiring layer.

The light emitting device package may further include a second insulating layer disposed between the light emitting diode chip and the reflective substrate.

For example, the metal layer may include at least one metal selected from the group consisting of gold (Au), nickel (Ni), silver (Ag), copper (Cu) and palladium (Pd), or an alloy thereof.

The circuit substrate may further include a solder resist layer disposed on the metal layer such that the solder resist layer does not overlap the connection portion.

The at least one aligning hole may pass through the solder resist layer and expose the metal layer. In this case, reflectivity of the metal layer may be the same as or different from that of the reflective substrate.

Alternatively, the at least one aligning hole may pass through the circuit substrate and expose the reflective substrate.

Alternatively, the at least one aligning hole may pass through the metal layer and the wiring layer, and expose the first insulating layer.

The at least one aligning hole may be disposed in the connection portion, or may be disposed at a position spaced from the connection portion. In addition, the at least one aligning hole may include a first aligning hole disposed in the connection portion, and a second aligning hole disposed at a position spaced from the connection portion.

For example, a distance from the first aligning hole to the inside edge may be 0.45 mm, and a distance from the second aligning hole to the inside edge may be 1.176 mm. A distance from the second aligning hole to an end of the solder resist layer may be 1.28 mm.

The aligning hole may have a round plane shape or a polygonal plane shape.

The light emitting device package may further include a barrier layer disposed on the circuit substrate such that the barrier layer embeds the at least one aligning hole.

The barrier layer may be disposed on the solder resist layer, be disposed on the connection portion or extend from the solder resist layer to the connection portion.

For example, the barrier layer may include a silicone or white epoxy resin.

The light emitting device package may further include a molding portion sealing the at least one light emitting diode chip and the wire on the chip mounting region. The molding portion may include a phosphor.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Reference will now be made in detail to embodiments, examples of which are illustrated in the accompanying drawings for better understanding. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art.

Figure 1:
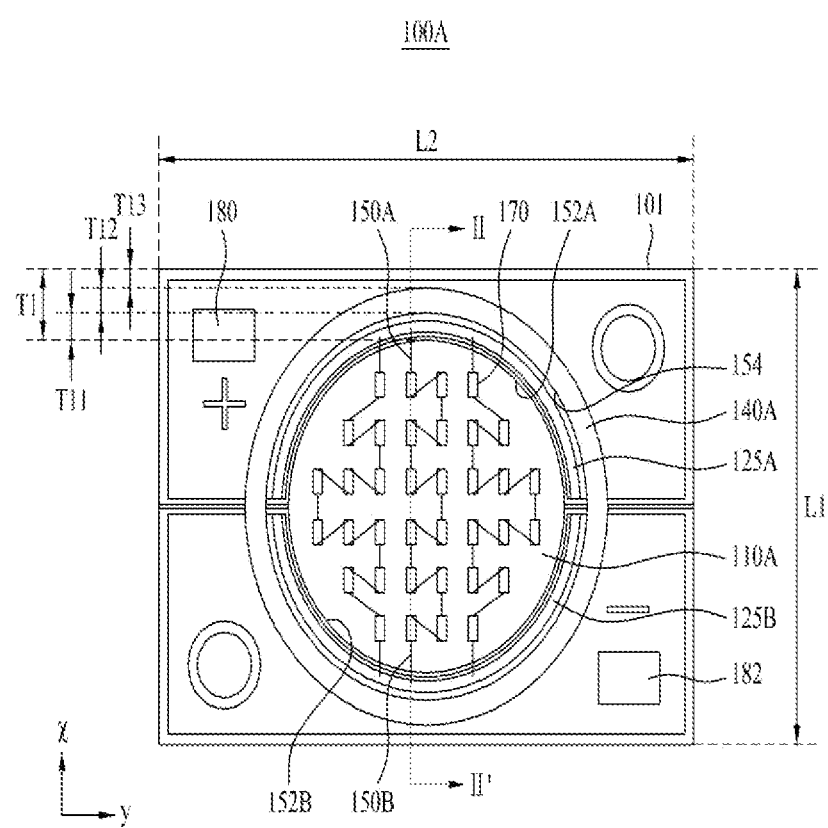
FIG. 1 is a plan view illustrating a light emitting device package according to one embodiment.

FIG. 1 is a plan view illustrating a light emitting device package 100A according to one embodiment.

Figure 2A:
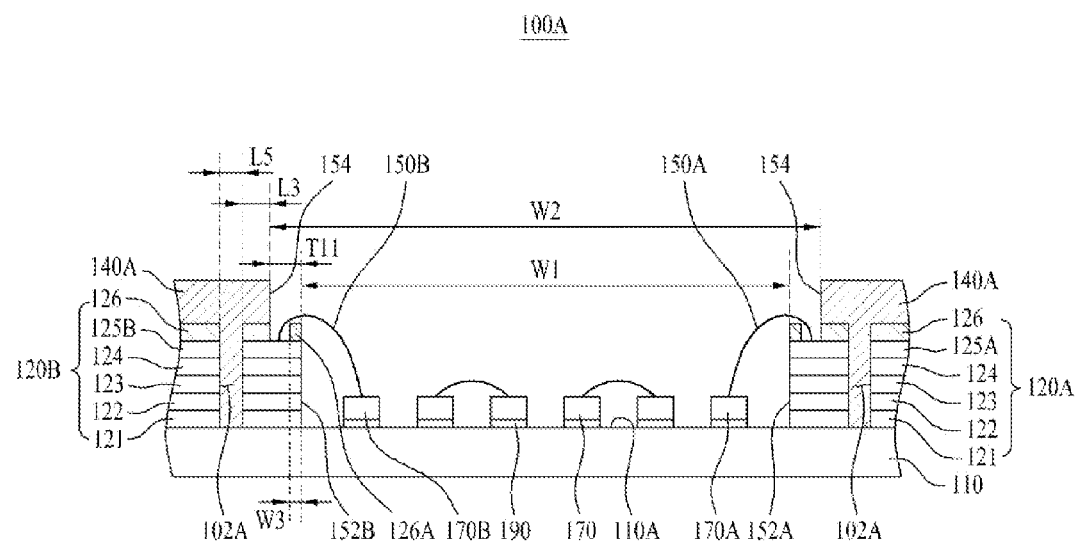
FIGS. 2A to 2C are sectional views illustrating embodiments of the light emitting device package taken along the line II-II' shown in FIG. 1.
Figure 2B:
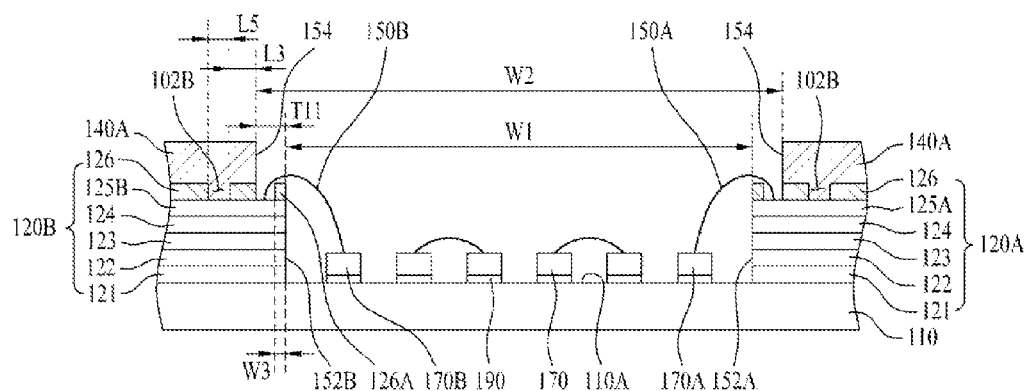
Figure 2C:
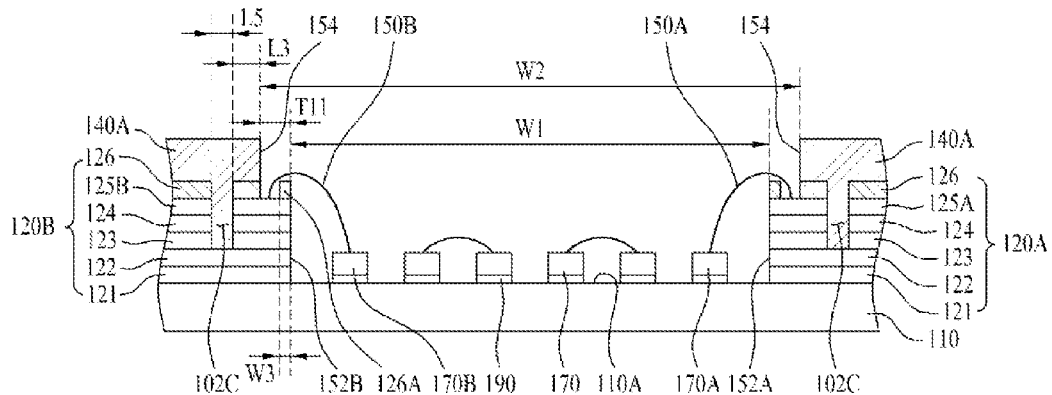

FIGS. 2A to 2C are sectional views of embodiments of the light emitting device package 100A taken along the line II-II' shown in FIG. 1.

The light emitting device package 100A shown in FIGS. 1 to 2C includes a reflective substrate 110, circuit substrates 120A and 120B, and light emitting diode chips 170.

The reflective substrate 110 functions to support the circuit substrates 120A and 120B of the light emitting device package 100A and includes a chip mounting region corresponding to a portion of the reflective substrate 110 defined and exposed by the circuit substrates 120A and 120B. For example, the chip mounting region means an upper surface 110A of the reflective substrate 110 on which the light emitting diode chip 170 is mounted.

The reflective substrate 110 includes a material having both light reflection property and light radiation property. For example, the reflective substrate 110 has a reflectivity of 95% and is formed of a metal selected from the group consisting of aluminum (Al), silver (Ag), platinum (Pt), rhodium (Rh), radium (Rd) and palladium (Pd), or an alloy thereof, but the embodiment is not limited thereto.

In this case, when a desired level of reflectivity cannot be obtained with only the reflective substrate 110, a reflective coating layer (not shown) to improve reflectivity of the reflective substrate 110 may be further disposed in an upper part of the reflective substrate 110. The reflective coating layer may be formed of a material which is the same as or different from a material constituting the reflective substrate 110.

In addition, when the reflective coating layer is not disposed in the upper part of the reflective substrate 110, an anti-corrosion layer (not shown) to prevent corrosion of the reflective substrate 110 may be further disposed in the upper part of the reflective substrate 110.

In addition, when the reflective coating layer is disposed in the upper part of the reflective substrate 110, an anti-corrosion layer (not shown) to prevent corrosion of the reflective coating layer may be disposed in the upper part of the reflective coating layer.

The anti-corrosion layer may comprise a light-transmitting resin.

The circuit substrates 120A and 120B are disposed on the reflective substrate 110 and include first and second inside edges 152A and 152B and at least one aligning holes 102A, 102B and 102C. The first and second inside edges 152A and 152B define the chip mounting region 110A and the aligning holes 102A, 102B, and 102C are spaced from the first and second inside edges 152A and 152B.

Here, the first and second inside edges 152A and 152B of the circuit substrates 120A and 120B may have a round shape, when seen from the top vertical to X and Y axes shown in FIG. 1. For example, the first and second inside edges 152A and 152B may have a circular shape, an oval shape or a polygonal shape having a round edge, as shown in FIG. 1. Alternatively, the first and second inside edges 152A and 152B may have a polygonal shape, when seen from the top vertical to X and Y axes shown in FIG. 1.

The circuit substrate may include first and second circuit substrates 120A and 120B which face each other with interposing the chip mounting region 110A therebetween. The first circuit substrate 120A has a first inside edge 152A which defines one portion of the chip mounting region 110A and the second circuit substrate 120B has a second inside edge 152B which defines another portion of the chip mounting region 110A. Each of the first and second circuit substrates 120A and 120B may have at least one aligning holes 102A, 102B, and 102C.

Referring to FIGS. 2A to 2C, the circuit substrates 120A and 120B may include a first insulating layer 122, a wiring layer 124 and metal layers 125A and 125B.

The wiring layer 124 has an electrical circuit pattern and is realized with copper (Cu) or the like.

The first insulating layer 122 is disposed between the wiring layer 124 and the reflective substrate 110 to insulate the wiring layer 124 from the reflective substrate 110. For example, the first insulating layer 122 may comprise an epoxy or polyamide resin, or oxide or nitride.

The metal layers 125A and 125B have a connection portion T11 which is disposed on the wiring layer 124 to electrically connect the wires 150A and 150B connected to the light emitting diode chip 170 to the wiring layers 125A and 125B.

For example, the metal layers 125A and 125B include first and second electrode layers 125A and 125B which are electrically separated from one another. The first and second electrode layers 125A and 125B may be symmetrical to each other, as shown in FIG. 1, but may have a variety of shapes without limitation thereto. The first electrode layer 125A is connected to the first electrode pad 180 and the second electrode layer 125B is connected to the second electrode pad 182. Accordingly, current may be supplied from the first and second electrode pads 180 and 182 to the light emitting diode chip 170 via the first and second electrode layers 125A and 125B and the wires 150A and 150B. That is, the first and second electrode pads 180 and 182 are connected to first and second electrode layers 125A and 125B, respectively, and the first and second electrode layers 125A and 125B are connected to the corresponding light emitting diode chips 170 via the wires 150A and 150B, respectively.

The metal layers 125A and 125B may for example be formed of a metal selected from the group consisting of gold (Au), nickel (Ni), silver (Ag), copper (Cu) and palladium (Pd), or an alloy thereof, but the embodiment is not limited thereto.

Meanwhile, the circuit substrates 120A and 120B may further include first and second adhesive layers 121 and 123. The first adhesive layer 121 functions to adhere the first insulating layer 122 to the reflective substrate 110 and the second adhesive layer 123 functions to adhere the first insulating layer 122 to the wiring layer 124. The first and second adhesive layers 121 and 123 may have conductive adhesivity or insulating transparent adhesivity. The first and second adhesive layers 121 and 123 having conductive adhesivity may be for example formed of a metal selected from the group consisting of lead (Pb), gold (Au), tin (Sn), Indium (In), silver (Ag), nickel (Ni), niobium (Nb) and copper (Cu), or an alloy thereof. In addition, the first and second adhesive layers 121 and 123 having insulating transparent adhesivity may be formed of a material selected from the group consisting of polyimide (PI), benzocyclobutene (BCB), and PFCB (perfluorocyclobutene), or an alloy thereof.

The circuit substrates 120A and 120B may further include a solder resist layer 126 which is disposed on the metal layers 125A and 125B such that it does not overlap the connection portion T11. The solder resist layer 126 defines the connection portion T11 of the metal layers 125A and 125B. In this case, a solder resist layer 126A may be further disposed at an exposed edge of the metal layers 125A and 125B, or be omitted, and the embodiment is not limited thereto. Hereinafter, although the solder resist layer 126A is illustrated in the connection portion T11, the connection portion T11 is represented with considering the solder resist layer 126A to be omitted.

In addition, the light emitting device package 100A may further include a barrier layer 140A. The barrier layer 140A may be guided by the aligning holes 102A, 102B, and 102C, be embedded in the aligning holes 102A, 102B, and 102C, cover at least portion of the metal layers 125A and 125B, and function as a dam which fills and confine a molding portion 160 described later.

Figure 3:
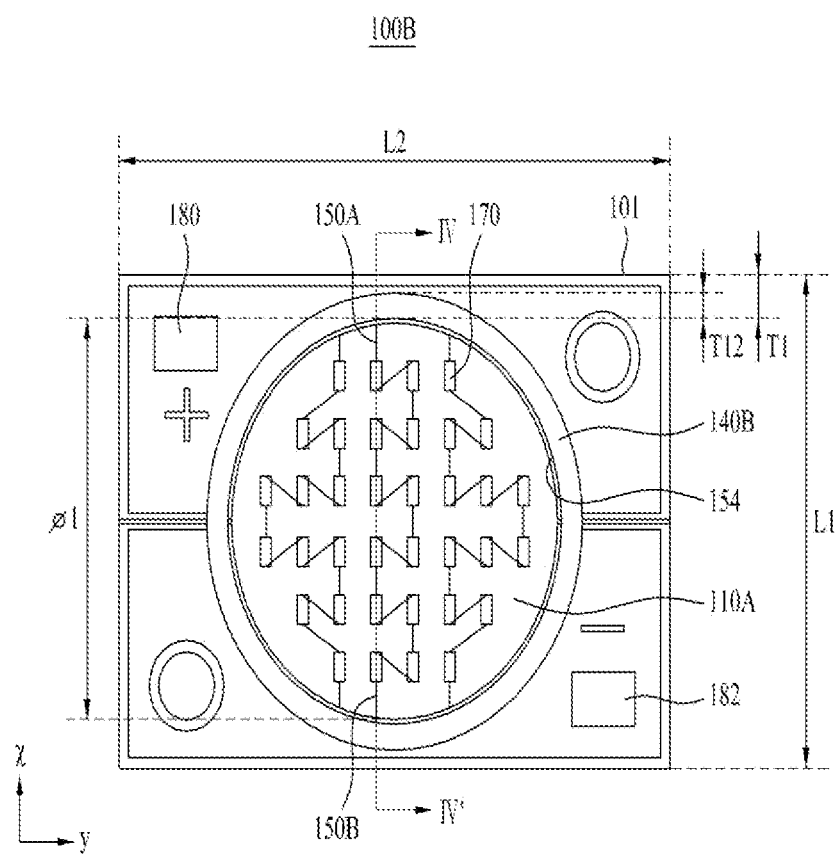
FIG. 3 is a plan view illustrating a light emitting device package according to another embodiment.

FIG. 3 is a plan view illustrating a light emitting device package 100B according to another embodiment.

Figure 4A:
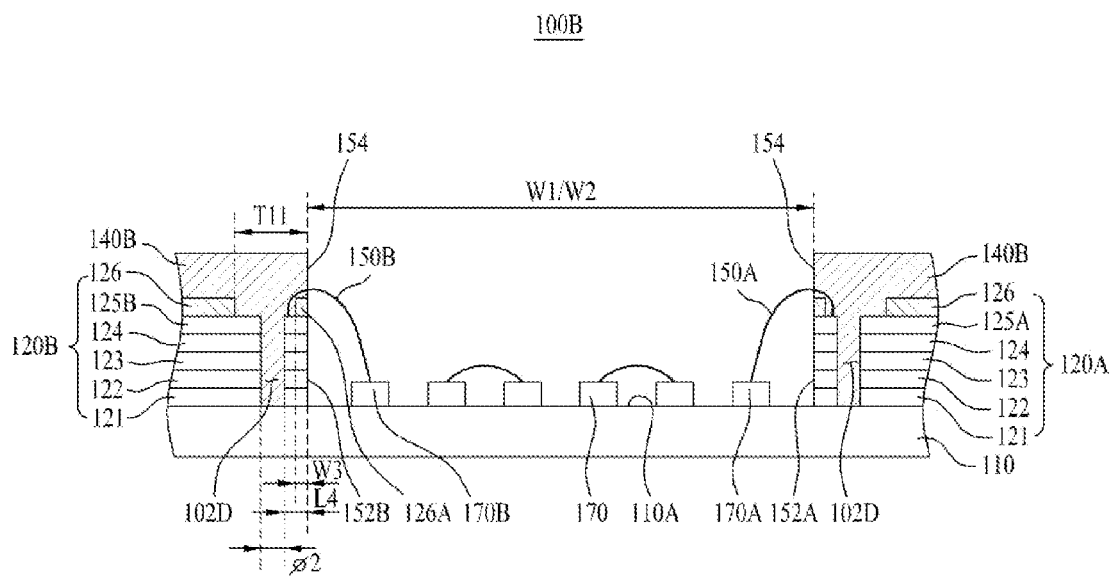
FIGS. 4A and 4B are sectional views illustrating embodiments of the light emitting device package taken along the line IV-IV' shown in FIG. 3.
Figure 4B:
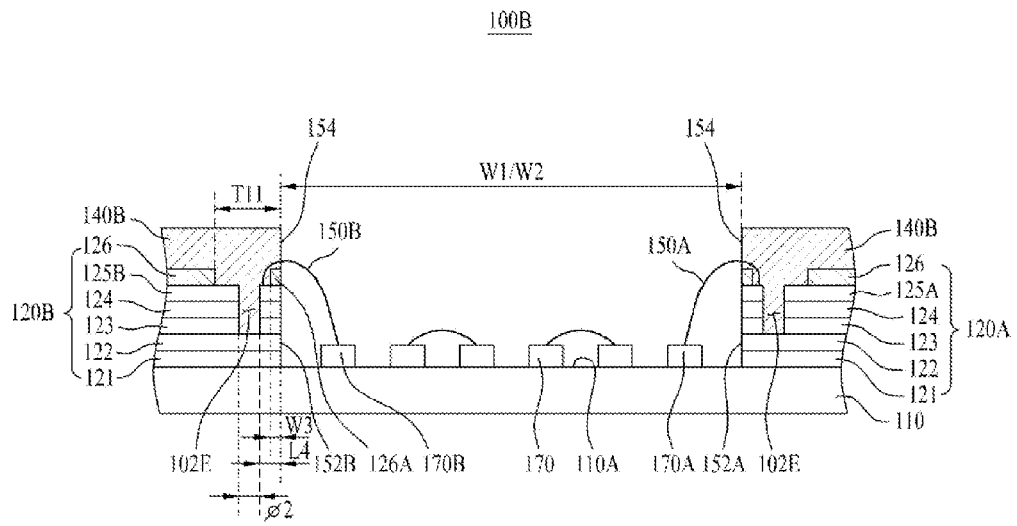

FIGS. 4A and 4B are sectional views of embodiments of the light emitting device package 100B taken along the line IV-IV' shown in FIG. 3.

Figure 5:
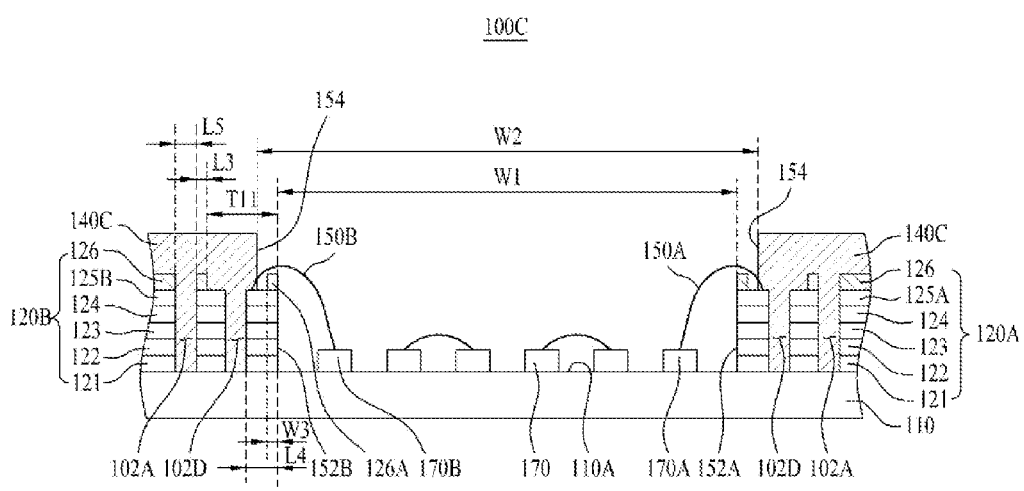
FIG. 5 is a sectional view illustrating a light emitting device package according to another embodiment.

FIG. 5 is a sectional view illustrating a light emitting device package 100C according to another embodiment.

The barrier layers 140A and 140C of the light emitting device packages 100A and 100C shown in FIGS. 1, 2A to 2C, and 5 may cover only a part of the metal layers 125A and 125B. That is, the barrier layer 140A of the light emitting device package 100A shown in FIGS. 1, and 2A to 2C covers only a part of the metal layers 125A and 125B via the solder resist layer 126. As shown in FIGS. 1, and 2A to 2C, the barrier layer 140A may be disposed in an upper part of the solder resist layer 126 and may be not disposed in an upper part of the connection portion T11.

Alternatively, as shown in FIG. 5, the barrier layer 140C in the light emitting device package 100C may be disposed with being extended from the solder resist layer 126 to the connection portion T11.

Alternatively, as shown in FIGS. 3, 4A, and 4B, the barrier layer 140B of the light emitting device package 100B may cover the metal layers 125A and 125B so as not to expose the connection portion T11 of the metal layers 125A and 125B.

Hereinafter, the same components in the light emitting device packages 100A, 100B, and 100C shown in FIGS. 1 to 5 are represented by like reference numerals and are not described repeatedly.

As described above, in the light emitting device packages 100A and 100C shown in FIGS. 1, 2A to 2C, and 5, since the upper surface of the metal layers 125A and 125B is partially exposed, without being covered with the barrier layers 140A and 140C, light emitted from the light emitting diode chip 170 is scattered by the exposed upper surface of the metal layers 125A and 125B and light speed may be thus deteriorated. However, since the upper surface of the metal layers 125A and 125B in the light emitting device package 100B shown in FIGS. 3, 4A and 4B is completely covered with the barrier layer 140B and is not exposed, scattering of light emitted from the light emitting diode chip 170 is minimized and superior light extraction efficiency is thus obtained, unlike the light emitting device packages 100A and 100C shown in FIGS. 1, 2A to 2C, and 5.

Meanwhile, a width W1 between the first and second inside edges 152A and 152B defining the chip mounting region 110A in the circuit substrates 120A and 120B, and a width W2 between the third and fourth inside edges 154A and 154B defined by the barrier layers 140A, 140B, and 140C may be identical, as shown in FIGS. 4A and 4B, and may be different, as shown in FIGS. 2A to 2C, and 5. For example, as shown in FIGS. 2A to 2C, or FIG. 5, the width W2 may be greater than the width W1. The width W1 between the first and second inside edges 152A and 152B corresponds to the width of the chip mounting region 110A.

The barrier layers 140A and 140B may have a ring shape as shown in FIGS. 1 and 3, but the embodiment is not limited thereto. In addition, the barrier layers 140A, 140B, and 140C shown in FIGS. 1 to 5 may contain a silicone or white epoxy resin, but the embodiment is not limited thereto.

Meanwhile, referring to FIGS. 2A to 2C, the light emitting device package 100A may further include a second insulating layer 190. The second insulating layer 190 is disposed between the light emitting diode chip 170 and the chip mounting region 110A of the reflective substrate 110 to isolate the light emitting diode chip 170 from the reflective substrate 110. When the second insulating layer 190 is disposed, heat dissipation of the light emitting diode chip 170 may be deteriorated. For this reason, the second insulating layer 190 comprises a heat dissipation material to secure heat dissipation property. Alternatively, as shown in FIGS. 4A, 4B, and 5, the second insulating layer 190 may be omitted in the light emitting device packages 100B and 100C.

In this case, the second insulating layer 190 may also function as the afore-mentioned anti-corrosion layer (not shown) to prevent corrosion of the reflective substrate 110.

The second insulating layer 190 may contain a material which is the same as or different from that of the first insulating layer 122. For example, the second insulating layer 190 may contain an epoxy or polyamide resin, or oxide or nitride having high heat conductivity.

At least one light emitting diode chip 170 shown in FIGS. 1 to 5 is disposed on the chip mounting region 110A of the reflective substrate 110, and is connected to the connection portions T11 of the metal layers 125A and 125B of the circuit substrates 120A and 120B through the wires 150A and 150B, respectively. As shown in FIGS. 1 to 5, a plurality of the light emitting diode chips 170 may be disposed, but the embodiment is not limited thereto. Namely, only one light emitting diode chip 170 may be disposed.

When the light emitting diode chip 170 includes two or more light emitting diode chips 170, some of the light emitting diode chips 170 may be connected to one another by at least one of parallel and series connection methods and the remaining of the light emitting diode chips 170 may be connected to the metal layers 125A and 125B by wire bonding.

The afore-mentioned light emitting diode chips 170 may be classified into horizontal- or vertical-type light emitting diode chips according to electrode position. The light emitting diode of the light emitting diode chip 170 may include a light emitting structure including an n-type semiconductor layer, an active layer and a p-type semiconductor layer laminated in this order, and an n-type electrode and a p-type electrode which supply electrons and holes to the n-type semiconductor layer and the p-type semiconductor layer, respectively. The n-type semiconductor layer and the p-type semiconductor layer may be formed of a semiconductor compound and for example comprise a semiconductor material having a formula of $In_xAl_yGa_{1-x-y}N$ ($0 \leq x \leq 1$, $0 \leq y \leq 1$, $0 \leq x+y \leq 1$).

Regarding the light emitting device packages 100A and 100B shown in FIGS. 1 and 3, twelve light emitting diode chips 170 are connected in series between the first wire 150A connected to the first electrode layer 125A, and the second wire 150B connected to the second electrode layer 125B, but a different number of light emitting diode chips may be connected in parallel or series, but the embodiment is not limited thereto.

The portions of the wires 150A and 150B connected to the metal layers 125A and 125B are completely exposed without being embedded in the barrier layer 140A, as shown in FIGS. 2A to 2C, or are completely embedded in the barrier layer 140B, as shown in FIGS. 4A and 4B, or are partially embedded in the barrier layer 140C, as shown in FIG. 5.

Meanwhile, as shown in FIGS. 2A, 4A, and 5, the aligning holes 102A and 102D may pass through the circuit substrates 120A and 120B and expose the reflective substrate 110. For example, the aligning hole 102A may be spaced from the connection portion T11, as shown in FIG. 2A, or the aligning hole 102D may be disposed in the connection portion T11, as shown in FIG. 4A. Alternatively, as shown in FIG. 5, the first and second aligning holes 102A and 102D may be disposed in plural in each of the first and second circuit substrates 120A and 120B. That is, as shown in FIG. 5, the first aligning hole 102D is disposed in the connection portion T11 and the second aligning hole 102A is spaced from the connection portion T11.

Alternatively, as shown in FIG. 2B, the aligning hole 102B may pass through the solder resist layer 126 and expose only the metal layers 125A and 125B. Reflectivity of the metal layers 125A and 125B may be the same as or different from that of the reflective substrate 110. In addition, as shown in FIG. 2B, the aligning hole 102B exposing only the metal layers 125A and 125B is not shown, but is further disposed in the connection portion T11 or only in the connection portion T11.

Alternatively, as shown in FIGS. 2C and 4B, the aligning holes 102C and 102E may pass through the metal layers 125A and 125B, the wiring layer 124, and the second adhesive layer 123 of the circuit substrates 120A and 120B and expose the first insulating layer 122. The aligning holes 120C and 102E exposing the first insulating layer 122 are spaced from the connection portion T11, as shown in FIG. 2C, or are disposed in the connection portion T11, as shown in FIG. 4B, or one thereof is disposed in the connection portion T11 and another is spaced from the connection portion T11, although not shown.

Regarding the cross-sectional shape of the light emitting device package shown in FIGS. 2A to 2C, 4A, and 4B, and 5, at least one of various shapes of aligning holes 102A to 102E may be disposed in at least one of positions provided in the connection portion T11 and positions spaced from the connection portion T11. However, at least one of the aligning holes 102A to 102C having various shapes may be disposed in at least one of positions provided in the connection portion T11 and positions spaced from the connection portion T11.

Conventionally, light and darkness of camera images are recognized based on the connection portion T11 exposed as shown in FIGS. 2A to 2C, instead of the aligning holes 102A to 102E, and positions at which the light emitting diode chips 170 are mounted, and positions at which the wires 150A and 150B are bonded, are arranged, based on the recognition results. In this case, since light and darkness of the exposed connection portion T11 and the solder resist layer 126 are not clearly distinguished due to excessively high specular reflectivity of the reflective substrate 110, the intended arrangement is impossible.

However, in the present embodiment, as described above, one or more aligning holes 102A to 102E are disposed in the circuit substrates 120A and 120B. Accordingly, light and darkness of camera images are recognized, based on the aligning holes 102A to 102E and clear recognition between light and darkness is possible using recognition results, although specular reflectivity of the reflective substrate 110 is high during die bonding or wire bonding. For example, as shown in FIGS. 2A, 2B, 4A, and 5, when the aligning holes 102A, 102B, and 102D are disposed, reflectivity of the bottom surface of the aligning holes 102A, 102B, and 102D is higher than reflectivity of a neighboring portion thereof and thus light and darkness of camera images are more clearly recognized. Alternatively, as shown in FIGS. 2C and 4B, when the aligning holes 102C and 102E are disposed, reflectivity of the bottom surface of the aligning holes 102C and 102E is lower than reflectivity of a neighboring portion thereof, and thus light and darkness of camera images are more clearly recognized. Accordingly, when the aligning holes 102A to 102E described above are used, the position of the chip mounting region 110A at which the light emitting diode chips 170 are mounted, and positions at which the wires 150A and 150B are bonded to the metal layers 125A and 125B are accurately recognized or arranged.

Furthermore, as described above, the aligning holes 102A to 102E also function to guide positions of the embedded barrier layers 140A, 140B, and 140C.

Furthermore, the aligning holes 102A to 102E improve air-tightness between the barrier layers 140A, 140B, and 140C and the reflective substrate 110.

Meanwhile, the light emitting device packages 100A, 100B, and 100C may have a polygonal or round shape. For example, as shown in FIGS. 1 and 3, the light emitting device packages 100A and 100B may have a rectangular plane shape.

When the barrier layer 140B completely covers the upper surfaces of metal layers 125A and 125B and do not expose the same, as shown in FIGS. 3, 4A, and 4B, the width W1 of the chip mounting region 110A may be further increased, as compared to a case in which the barrier layers 140A and 140C partially expose the upper surfaces of the metal layers 125A and 125B, as shown in FIGS. 1, 2A to 2C, and 5. As such, when the width W1 of the chip mounting region 110A increases, more light emitting diode chips 170 are mounted on the chip mounting region 110A in the light emitting device package having a constant size and luminous efficacy is thus improved.

For example, when the light emitting device packages 100A and 100B have a rectangular plane shape, as shown in FIGS. 1 and 3, a size of the plane surface of the light emitting device packages 100A and 100B may be determined by a length L1 of a first direction x and a length L2 of a second direction y.

In this case, an area of the chip mounting region 110A shown in FIGS. 1 and 3 is determined by at least one of a shorter length among the lengths L1 and L2, a width T11 of the connection portion in the metal layers 125A and 125B, a width T12 of the barrier layers 140A and 140B, and a distance T13 from the periphery of the barrier layers 140A and 140B to a lateral end 101 of the light emitting device packages 100A and 100B. That is, an area of the chip mounting region 110A, in which the light emitting diode chips 170 are disposed, is determined by the distance T1 from the lateral end 101 of the light emitting device packages 100A and 100B to the chip mounting region 110A.

For better understanding, assuming that the plane of the chip mounting region 110A has a circular shape and L1 is the shorter among L1 and L2, the area (LEDA) of the chip mounting region 110A in the light emitting device packages 100A and 100B shown in FIGS. 1 and 3 may be determined by the following Equation 1.

$$LEDA = \pi \left[ \frac{(L1 - 2T1)}{2} \right]^2 \quad \text{[Equation 1]}$$

In a case in which the widths T12 of the barrier layers 140A and 140B shown in FIGS. 1 and 3 are uniform, when the connection portion T11 of the metal layers 125A and 125B is covered with the barrier layer 140B and is not exposed to the outside, as shown in FIGS. 3, 4A, and 4B, the distance T1 becomes shorter, as compared to a case in which the connection portion T11 of the metal layers 125A and 125B is exposed, as shown in FIGS. 1, and 2A to 2C.

In addition, when the barrier layer 140C extends to the upper part of the connection portion T11, as exemplarily shown in FIG. 5, the distance T1 may become shorter, than a case in which the barrier layer 140A is not disposed in the upper part of the connection portion T11, as exemplarily shown in FIGS. 1, and 2A to 2C.

As can be seen from Equation 1, when the distance T1 becomes shorter, the area (LEDA) of the chip mounting region 110A increases. Accordingly, the light emitting device package 100B shown in FIGS. 3, 4A, and 4B has a large area chip mounting region 110A, as compared to the light emitting device package 100C shown in FIG. 5, and the light emitting device package 100C shown in FIG. 5 has a large LEDA, as compared to the light emitting device package 100A shown in FIGS. 1, and 2A to 2C.

For this reason, luminous efficacy is improved, since the largest number of light emitting diode chips 170 may be mounted on the light emitting device package 100B shown in FIG. 3, 4A, or 4B, among the light emitting device packages 100A, 100B, and 100C having the same size (L1*L2).

The shortest distance T1 from the lateral end 101 of the light emitting device package 100B shown in FIG. 3 to the chip mounting region 110A may be equivalent to the width T12 of the barrier layer 140B, when the distance T13 is '0'. For example, the shortest distance T1 is 1,100 μm to 1,260 μm.

In addition, the width T12 of the barrier layers 140A and 140B may be 800 μm to 1,200 μm, and the width T11 of the connection portion in the metal layers 125A and 125B may be 300 μm to 500 μm. The distance T13 may be at least 800 μm and is for example 950 μm. In addition, a ratio of the short length L1 of the light emitting device packages 100A, 100B, and 100C to a diameter ϕ1 of the chip mounting region 110A may be 1:0.7 to 0.9 (L1: ϕ1).

In addition, according to the present embodiment, the distance from at least one aligning hole 102A to 102E to the first or second inside edges 152A and 152B of the circuit substrates 120A and 120B may be a first reference distance determining the chip mounting region 110A. As shown in FIGS. 2A to 2C, and 5, the first reference distance may be represented by a sum of the width T11 of the connection portion, and the distance L3 from the aligning hole 102A, 102B, or 102C to the end of the solder resist layer 126. For example, the first reference distance L3+T11 may be 1.176 mm. Alternatively, as shown in FIGS. 4A, 4B, and 5, the first reference distance L4 from the aligning holes 102D and 102E to the inside edges 152A and 152B may be 0.45 mm. In a case in which the aligning holes 102A to 102E are recognized using a camera, when the first reference distance is predetermined, the light emitting diode chip 170 is die-bonded to an accurately recognized position of the chip mounting region 110A.

In addition, according to the present embodiment, the aligning holes 102A to 102E may have a round plane shape or a polygonal plane shape. When the aligning holes 102A to 102C have a polygonal plane shape, a length L5 of a side of the aligning holes 102A to 102C may be 0.4 mm. Alternatively, when the aligning holes 102D and 102E have a round plane shape, for example, circular plane shape, the diameter ϕ2 of the aligning holes 102D and 102E may be 0.4 mm.

In addition, when the chip mounting region 110A is accurately recognized, the connection portion T11 contributing to wire bonding is also readily recognized. The reason for this is that the distance between the light emitting diode chips 170A and 170B, that are the closest to the first and second inside edges 152A and 152B, and the first and second inside edges 152A and 152B, and the distance between the light emitting diode chips 170 are predetermined. Accordingly, the connection portion T11 used for wire bonding is recognized from the chip mounting region 110A.

Alternatively, the connection portion T11 is recognized using the aligning holes 102A to 102E. That is, the distance L3 from the aligning holes 102A to 102C shown in FIG. 2A to FIG. 2C, and FIG. 5 to the end of the solder resist layer 126 may be a second reference distance for recognizing the wire bonding region. When the solder resist layer 126A is disposed in the connection portion T11, a part of the connection portion T11 excluding the width W3 of the solder resist layer 126A may substantially correspond to the wire bonding region. For example, the width W3 is 100 μm and the distance L3 is 1.28 mm. Alternatively, as shown in FIGS. 4A, 4B, and 5, the second reference distance is a distance from the aligning holes 102D and 102E to the first and second inside edges 152A and 152B, which corresponds to the connection portion T11 used for wire bonding. In addition, the second reference distance is a distance from the aligning holes 102D and 102E to the end of the solder resist layer 126, which corresponds to the connection portion T11 used for wire bonding. When the solder resist layer 126A is disposed, a part of the connection portion T11 excluding the width W3 substantially corresponds to the wire bonding region.

The light emitting device packages 100A, 100B, and 100C shown in FIGS. 1 to 5 have a configuration in which the light emitting device packages 100A, 100B, and 100C is not filled with the molding portion 160 so as to illustrate connection between the light emitting diode chips 170. However, as described below, the light emitting device packages 100A, 100B, and 100C further include the molding portion 160. The molding portion 160 seals at least one light emitting diode chip 170 and the wires 150A and 150B on the chip mounting region 110A.

Meanwhile, the afore-mentioned light emitting device packages 100A, 100B, and 100C include a protection device such as Zener diode (not shown) connected to the light emitting diode chips 170 in a reverse direction to effectively block electrostatic discharge (ESD) voltage applied from the outside and thereby protect the light emitting diode chip 170.

Hereinafter, a method for manufacturing the light emitting device packages 100A and 100B will be described in brief below.

FIGS. 6A to 6D are views illustrating the method for manufacturing the light emitting device package 100A shown in FIG. 2A.

Figure 6A:
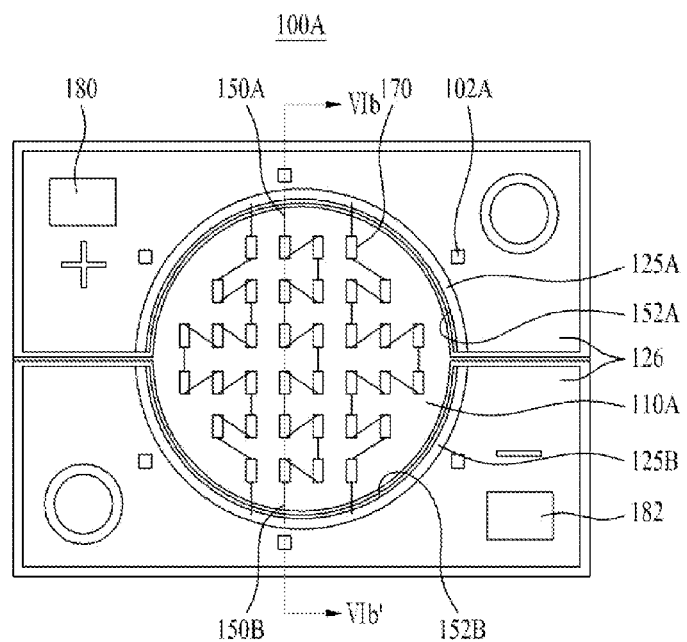
FIGS. 6A to 6D are views illustrating the method for manufacturing the light emitting device package shown in FIG. 2A.
Figure 6B:
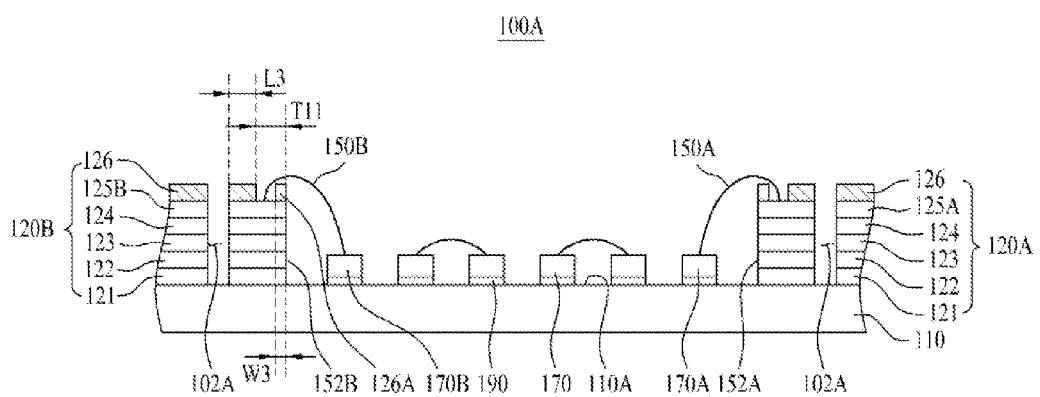
Figure 6C:
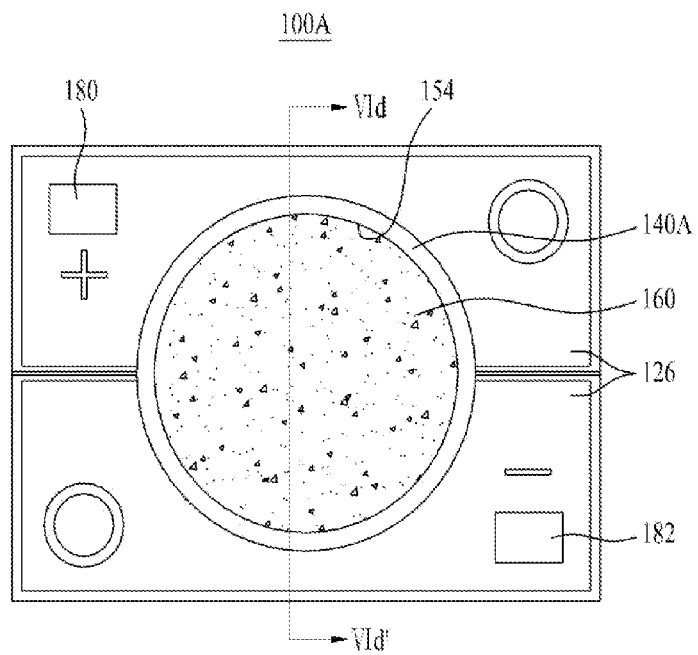
Figure 6D:
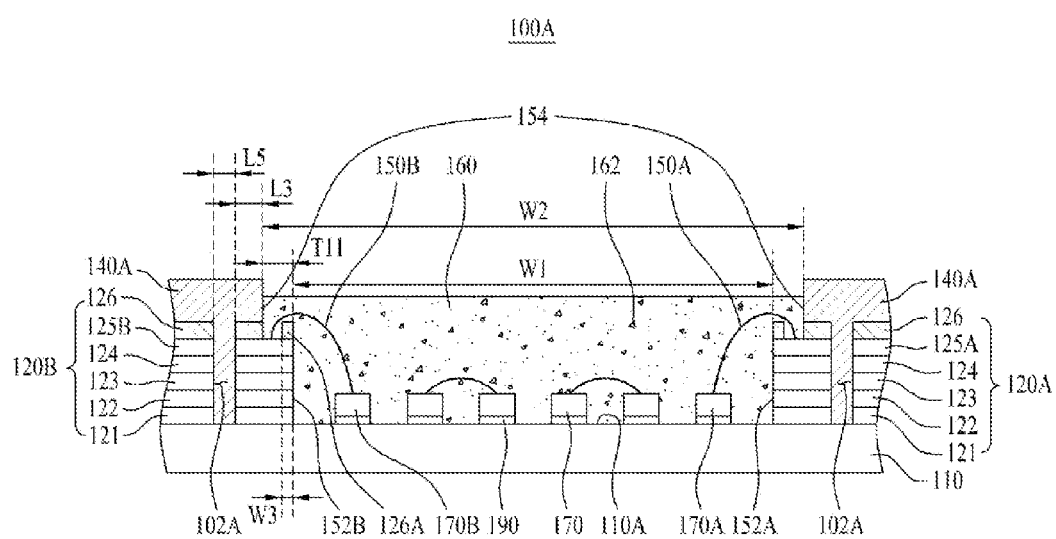

FIG. 6B is a sectional view taken along the line VIb-VIb' shown in FIG. 6A, and FIG. 6D is a sectional view taken along the line VId-VId' shown in FIG. 6C.

Referring to FIGS. 6A and 6B, circuit substrates 120A and 120B defining a chip mounting region 110A having a round plane shape are formed on the reflective substrate 110. That is, a first adhesive layer 121, a first insulating layer 122, a second adhesive layer 123 and a wiring layer 124 are formed on the reflective substrate 110, metal layers 125A and 125B are formed on the wiring layer 124, and a solder resist layer 126 is formed on the metal layers 125A and 125B.

At this time, an aligning hole 102A is formed at a position spaced from the connection portion T11. As described above, as shown in FIG. 6A, the aligning hole 102A may have a rectangular plane shape. Then, the chip mounting region 110A is recognized, based on the aligning hole 102A and a plurality of light emitting diode chips 170 are formed in the recognized chip mounting region 110A. Then, a connection portion T11 serving as a wire bonding region is recognized and the recognized connection portion T11 is connected to the light emitting diode chip 170 through the wires 150A and 150B. At this time, the aligning hole 102A may be used to recognize the connection portion T11, as described above.

Then, as shown in FIGS. 1 and 2A, a barrier layer 140A is formed on the upper surface of the solder resist layer 126 such that the connection portion T11 which is a part of an upper surface of the metal layers 125A and 125B is exposed.

Then, as shown in FIGS. 6C and 6D, the chip mounting region 110A is filled with the molding portion 160 sealing at least one light emitting diode chip 170 and the wires 150A and 150B to complete manufacturing of the light emitting device package 100A.

FIGS. 7A to 7D are views illustrating the method for manufacturing the light emitting device package 100B shown in FIG. 4A.

Figure 7A:
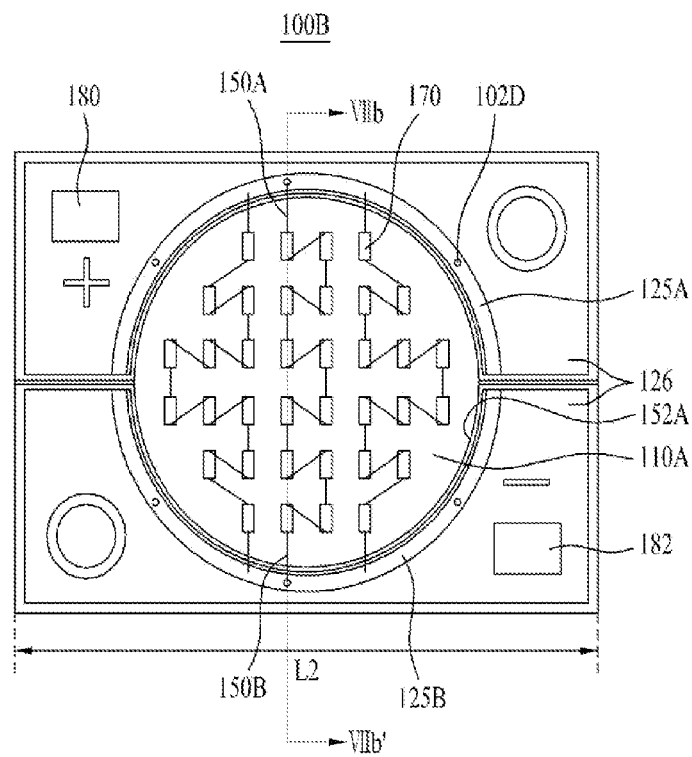
FIGS. 7A to 7D are views illustrating the method for manufacturing the light emitting device package shown in FIG. 4A.
Figure 7B:
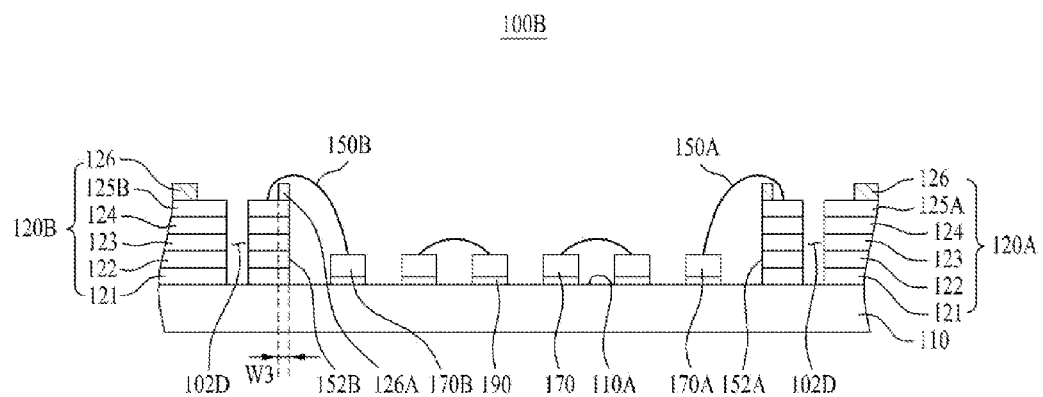
Figure 7C:
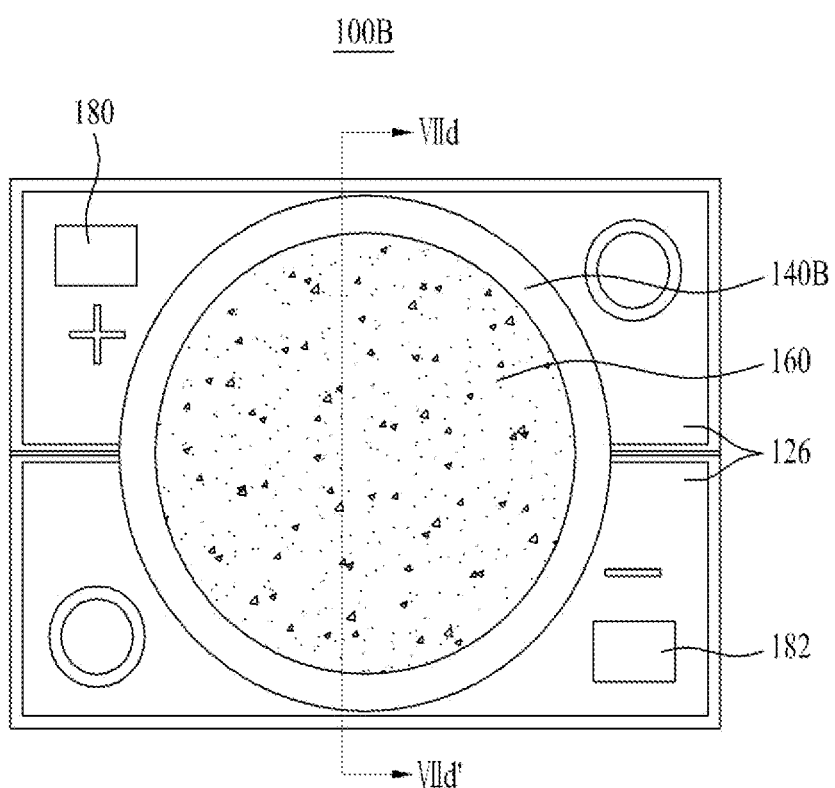
Figure 7D:
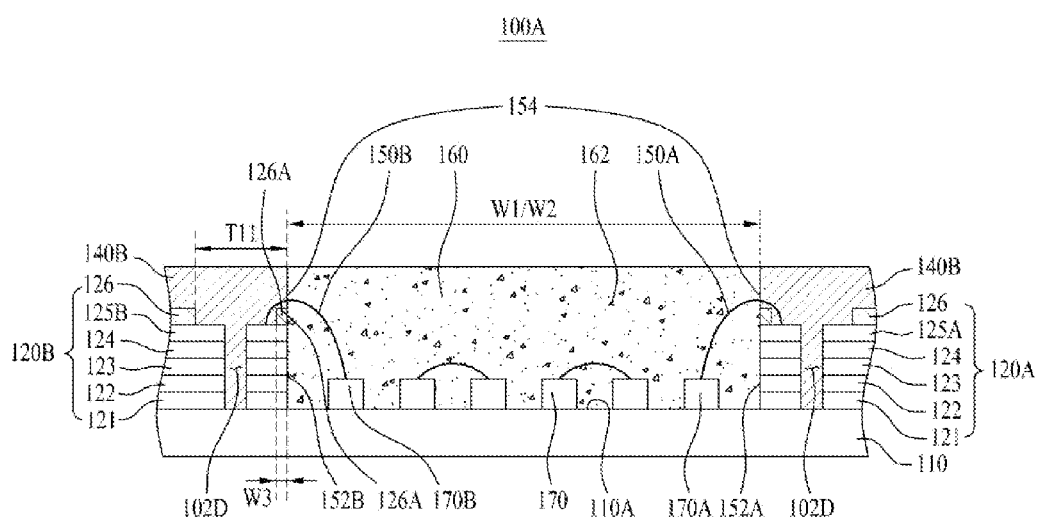

FIG. 7B is a sectional view taken along the line VIIb-VIIb' shown in FIG. 7A and FIG. 7D is a sectional view taken along the line VIId-VIId' shown in FIG. 7C.

Referring to FIGS. 7A and 7B, circuit substrates 120A and 120B defining a chip mounting region 110A having a round plane shape are formed on the reflective substrate 110. That is, a first adhesive layer 121, a first insulating layer 122, a second adhesive layer 123 and a wiring layer 124 are formed on the reflective substrate 110, metal layers 125A and 125B are formed on the wiring layer 124, and a solder resist layer 126 is formed on the metal layers 125A and 125B.

At this time, an aligning hole 102D is formed in the connection portion T11. As described above, as shown in FIG. 7A, the aligning hole 102D may have a circular plane shape. Then, the chip mounting region 110A is recognized, based on the aligning hole 102A and a plurality of light emitting diode chips 170 are formed in the recognized chip mounting region 110A. Then, a connection portion T11 serving as a wire bonding region is recognized and the recognized connection portion T11 is connected to the light emitting diode chip 170 through the wires 150A and 150B. As described above, the connection portion T11 used for wire bonding may be recognized, based on the aligning hole 102D.

Next, as shown in FIGS. 3 and 4A, a barrier layer 140B is formed on the upper surface of the solder resist layer 126, and the metal layers 125A and 125B, such that the upper surface of the metal layers 125A and 125B is not exposed.

Next, as shown in FIGS. 7C and 7D, the chip mounting region 110A is filled with the molding portion 160 sealing at least one light emitting diode chip 170 and the wires 150A and 150B to complete manufacture of the light emitting device package 100A.

The molding portion 160 is for example formed of a solid transparent resin, a silicone resin, an epoxy resin or a mixture thereof. The upper surface of the molding portion 160 may be round or flat and a lens or dome resin material (not shown) may be further disposed on the upper surface of the molding portion 160, although not shown.

A height of the molding portion 160 may be lower than that of the barrier layer 140A, as shown in FIG. 6D, or may be equivalent to that of the barrier layer 140B, as shown in FIG. 7D.

In addition, the molding portion 160 may further include a phosphor 162 so as to change wavelength of light emitted from the light emitting diode chip 170.

The phosphor 162 may include a garnet-based phosphor, a silicate-based phosphor, a nitride-based phosphor or an oxynitride-based phosphor.

For example, the garnet-based phosphor may be YAG ($Y_3Al_5O_{12}:Ce^{3+}$) or TAG ($Tb_3Al_5O_{12}:Ce^{3+}$), the silicate-based phosphor may be $(Sr, Ba, Mg, Ca)_2SiO_4:Eu^{2+}$, the nitride-based phosphor may be $CaAlSiN_3:Eu^{2+}$ containing SiN, and the oxynitride-based phosphor may be $Si_{6-x}Al_xO_xN_{8-x}:Eu^{2+}$ (0<x<6) containing SiON.

Meanwhile, the light emitting diode chips 170 are mounted in the light emitting device packages 100A, 100B, and 100C in a chip on board (COB) form, and may be integrated in an array or module form in one package, without limitation thereto.

In the light emitting device package according to the present embodiment, at least one aligning hole is disposed in the circuit substrate, light and darkness of camera images are recognized based on the aligning hole, and clear recognition of light and darkness is possible using the recognized results although specular reflectivity of the reflective substrate is high during die bonding or wire bonding. Therefore, the light emitting diode chips and the wires are aligned at accurate positions, guiding of the position of the embedded barrier layer is possible, and air-tightness between the barrier layer and the reflective substrate is improved.

Figure 8:
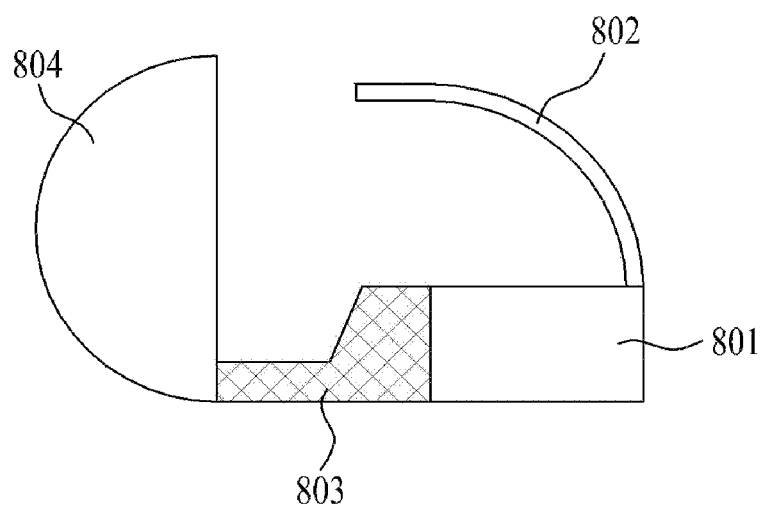
FIG. 8 is a view illustrating a headlamp using the light emitting device package according to one embodiment.

FIG. 8 is a view illustrating a headlamp using the light emitting device package according to one embodiment.

Referring to FIG. 8, light passing through a glass cover of the light emitting device package 801 is reflected by a reflector 802 and a shade 803, passes through a lens 804, and travels toward the front of a car body having the headlamp. The light emitting device package 801 corresponds to the light emitting device packages 100A, 100B, and 100C, shown in FIGS. 1 to 7D.

In addition, a plurality of light emitting device packages including the light emitting device package related to this embodiment are arrayed on a substrate, and optical members such as light guide plates, prism sheets, diffusion sheets or the like may be arranged in the light passage of the light emitting device packages. The light emitting device package, substrate and optical members may serve as light units. Another embodiment is realized with a display device, an indicator device or a lighting system including the semiconductor light emitting device or the light emitting device package mentioned in the previous embodiments, and examples of the lighting system may include lamps, street lights and the like.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
a reflective substrate including a chip mounting region;
a circuit substrate disposed on the reflective substrate, the circuit substrate including an inside edge defining the chip mounting region and at least one aligning hole disposed at a position spaced from the inside edge;
at least one light emitting diode chip disposed in the chip mounting region, the at least one light emitting diode chip being connected to the circuit substrate through a wire; and
a barrier layer disposed on the circuit substrate such that the barrier layer embeds the at least one aligning hole,
wherein the circuit substrate includes:
a wiring layer;
a first insulating layer disposed between the wiring layer and the reflective substrate;
a metal layer having a connection portion disposed on the wiring layer, the connection portion electrically connecting the wire connected to the light emitting diode chip to the wiring layer; and
a solder resist layer disposed on the metal layer such that the solder resist layer does not overlap the connection portion, and
wherein the at least one aligning hole passes through the solder resist layer and exposes the metal layer.

2. The light emitting device package according to claim 1, wherein the inside edge of the circuit substrate has a round shape.

3. The light emitting device package according to claim 1, wherein the circuit substrate comprises a first circuit substrate and a second circuit substrate facing each other with interposing the chip mounting region therebetween,
the first circuit substrate has a first inside edge defining one part of the chip mounting region,
the second circuit substrate has a second inside edge defining another part of the chip mounting region, and
each of the first and second circuit substrates has the at least one aligning hole.

4. The light emitting device package according to claim 1, further comprising a second insulating layer disposed between the light emitting diode chip and the reflective substrate.

5. The light emitting device package according to claim 1, wherein the metal layer comprises at least one metal selected from the group consisting of gold (Au), nickel (Ni), silver (Ag), copper (Cu) and palladium (Pd), or an alloy thereof.

6. The light emitting device package according to claim 1, wherein the at least one aligning hole is disposed at a position spaced from the connection portion.

7. The light emitting device package according to claim 1, wherein the aligning hole has a round plane shape or a polygonal plane shape.

8. The light emitting device package according to claim 1, wherein the barrier layer is disposed on the solder resist layer.

9. The light emitting device package according to claim 1, wherein the barrier layer covers at least a portion of the metal layer.

* * * * *